(12) United States Patent
McKee et al.

(10) Patent No.: US 6,559,050 B1
(45) Date of Patent: May 6, 2003

(54) PROCESS FOR HIGH THERMAL STABLE CONTACT FORMATION IN MANUFACTURING SUB-QUARTER-MICRON CMOS DEVICES

(75) Inventors: William R. McKee, Plano, TX (US); Jiong-Ping Lu, Dallas, TX (US); Ming-Jang Hwang, Dallas, TX (US); Dirk N. Anderson, Plano, TX (US); Wei Lee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 09/691,907

(22) Filed: Oct. 19, 2000

Related U.S. Application Data

(62) Division of application No. 09/363,800, filed on Jul. 29, 1999.
(60) Provisional application No. 60/102,227, filed on Sep. 29, 1998.

(51) Int. Cl.$^7$ ............................................. H01L 21/44
(52) U.S. Cl. ...................... 438/656; 438/629; 438/648; 438/666; 438/672; 438/685
(58) Field of Search ................................. 438/629, 630, 438/648, 649, 655, 656, 666, 667, 672, 675, 683, 685

(56) References Cited

U.S. PATENT DOCUMENTS

| | | | |
|---|---|---|---|
| 4,994,410 A | * 2/1991 | Sun et al. ..................... | 438/649 |
| 5,066,615 A | 11/1991 | Brady et al. ................. | 437/229 |
| 5,899,741 A | 5/1999 | Tseng et al. ................. | 438/649 |
| 5,913,145 A | 6/1999 | Lu et al. ...................... | 438/643 |
| 6,025,264 A | 2/2000 | Yew et al. .................... | 438/627 |
| 6,147,000 A | * 11/2000 | You et al. .................... | 438/629 |
| 6,221,792 B1 | * 4/2001 | Yang et al. ................... | 438/683 |

* cited by examiner

*Primary Examiner*—Kevin M. Picardat
(74) *Attorney, Agent, or Firm*—Jacqueline J. Garner; W. James Brady, III; Frederick J. Telecky, Jr.

(57) ABSTRACT

A conducting plug/contact structure for use with integrated circuit includes a tungsten conducting plug formed in the via with a tungsten-silicon-nitride ($WSi_yN_z$) region providing the interface between the tungsten conducting plug and the substrate (silicon) layer. The interface region is formed providing a nitrided surface layer over the exposed dielectric surfaces and the exposed substrate surface (i.e., exposed by a via in the dielectric layer) prior to the formation of tungsten/tungsten nitride layer filling the via. The structure is annealed forming a tungsten conducting plug with a tungsten-silicon-nitride interface between the conducting plug and the substrate. According to another embodiment, a tungsten nitride surface layer is formed over the nitrided surface layer prior to the formation of a tungsten layer to fill the via. According to another embodiment, a silicon surface layer is applied to the exposed surface of the dielectric layer and to the exposed surface of the substrate prior to formation of the nitrided surface layer. A layer of tungsten, tungsten/tungsten nitride, or tungsten nitride is formed to fill the via. After annealing, a tungsten conducting plug is formed with a tungsten-silicon-nitride interface region with the substrate.

9 Claims, 2 Drawing Sheets

US 6,559,050 B1

PROCESS FOR HIGH THERMAL STABLE CONTACT FORMATION IN MANUFACTURING SUB-QUARTER-MICRON CMOS DEVICES

This is a divisional application Ser. No. 09/363,800 filed Jul. 29, 1999 which is a non-provisional application of provisional application No. 60/102,227 filed Sep. 29, 1998.

BACKGROUND OF THE INVENTION

1. Field of the Invention

This invention relates generally to semiconductor integrated circuits and, more particularly, to the conducting plugs that provide a conducting path through the insulating layer in an integrated circuit.

2. Description of the Prior Art

As the sub-quarter micron complementary metal oxide semiconductor devices have been developed, many promising approaches require conducting plugs to withstand higher temperatures than are necessary for prior art devices. In particular, the conducting plugs have typically used a titanium/titanium nitride interface to increase the cohesion of the conducting plug to the substrate and to provide a diffusion barrier.

Referring to FIG. 1, the preliminary steps in forming a conducting plug according to the prior art is shown. A dielectric layer 11 is formed over a silicon substrate 10. A via 13 is formed in the dielectric layer 11, the via extending the substrate 10. A titanium/titanium nitride layer 12 is formed over the surface of the dielectric 11, the walls of the via 13, and the exposed substrate 10 surface. A tungsten layer 14 is formed over the exposed surface of titanium/titanium nitride layer 12 in sufficient depth to fill the via 13. In process steps not illustrated, the tungsten layer 14 and the titanium/titanium nitride layer 12 are planarized, thereby providing a surface consisting of the dielectric 11 region and an exposed tungsten plug 13.

Without the titanium/titanium nitride layer 12, the mechanical coupling, and therefore the electrical coupling between the tungsten 13 and the silicon substrate is found to be unsatisfactory. The titanium/titanium nitride layer also provides a barrier for the diffusion of tungsten into the substrate. While the titanium/titanium nitride layer 12 provides a satisfactory solution to the mechanical/electrical coupling between the tungsten 13 and the silicon substrate 10, this solution results in other problems. For example, forming the titanium/titanium nitride layer requires an additional deposition chamber. In addition, the structure is not thermally stable at the 850° C. temperatures that are required for annealing of the contact bitline structure.

A need has been felt for a contact/conducting plug structure that can withstand the high temperatures required to form bitline and capacitor integrated circuit elements while providing a relatively low resistivity.

SUMMARY OF THE INVENTION

The aforementioned and other features are accomplished, according to the present invention, by creating a tungsten conducting plug with a tungsten-silicon-nitride ($WSi_yN_z$) interface between the tungsten plug and the silicon substrate. After forming a via in the dielectric layer, the via exposing a portion of the silicon substrate, a nitrided surface layer is formed on the exposed dielectric layer and silicon layer surfaces. Then a layer of tungsten, tungsten nitride, or a mixture thereof is formed wherein the via is now filled. An annealing process removes the nitrogen in the conducting plug, but leaves a tungsten-silicon-nitride contact/barrier region between the tungsten plug and the silicon substrate. In another embodiment, a thin silicon layer is formed on the exposed dielectric layer and silicon layer surfaces prior to the formation of the nitrided surface layer. In another embodiment, a thin layer of tungsten nitride is formed over the nitrided layer covering the exposed dielectric layer and silicon layer surfaces. Thereafter, a layer of tungsten is formed, a layer that fills the via, prior to the annealing step.

These and other features of the present invention will be understood upon the reading of the following description in conjunction with the Figures.

DESCRIPTION OF THE PREFERRED EMBODIMENT(S)

1. Detailed Description of the Drawings

Figure 1:
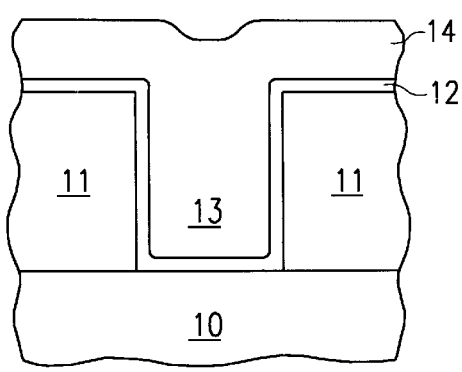
FIG. 1 is a cross-sectional view of a conducting plug formed by the procedures of the prior art.
Figure 2A:
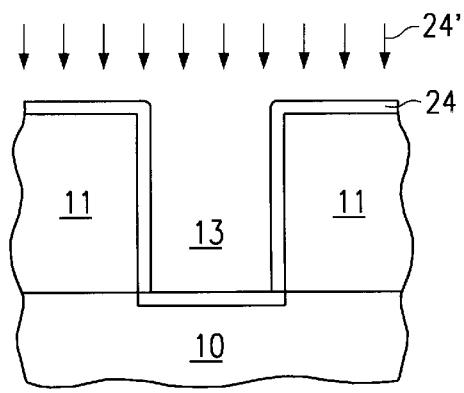
FIG. 2A through FIG. 2C illustrate a cross-sectional view of the formation of a conducting tungsten plug according to a first embodiment of the present invention.
Figure 2B:
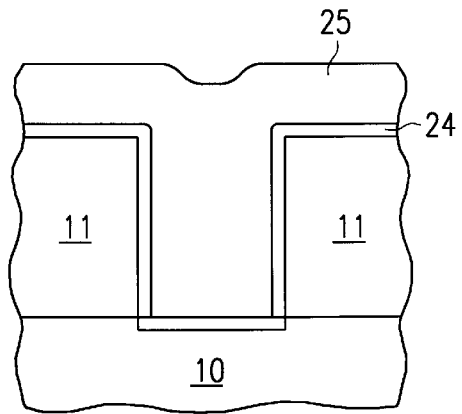
Figure 2C:
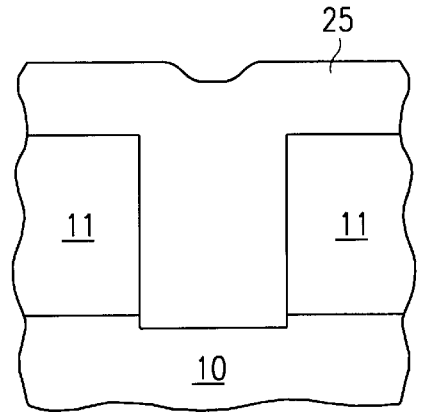

Referring to FIG. 2A through FIG. 2C. the process for providing a contact between a tungsten plug and a substrate 10 is shown. In FIG. 2A, a via 13 has been formed in the dielectric layer 11. This structure is then exposed to (H2 +N2) or a (NH3 +H2) plasma 24' (at a pressure of 0.5 to 5 torr) forming a nitrided layer 24 over the exposed dielectric 11 surfaces and the exposed substrate 10 surface. In FIG. 2B, a layer of tugnsten nitride ($WN_x$) 25 is formed (e.g., by a plasma enhanced chemical vapor deposition) over the surface of the nitrided layer 24 in such a manner that the via 13 is filled. In FIG. 2C, the structure is annealed at 800°–850° C. for 15–60 minutes, although other temperature ranges and time periods can be required to achieve the following result. As a result of the annealing, the tungsten nitride layer 25 is converted to a tungsten layer 25 with a tungsten-silicon-nitride material at the interface of the tungsten plug with the substrate.

Figure 3A:
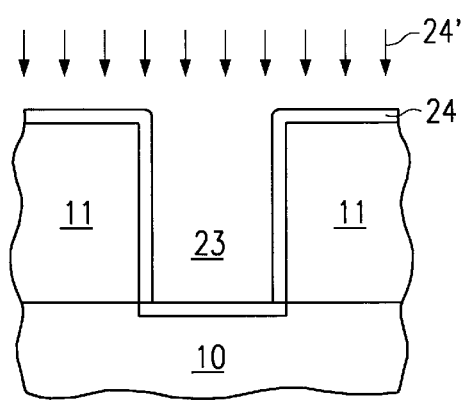
FIG. 3A through FIG. 3C illustrate a cross-sectional view of the formation of a conducting tungsten plug according to a second embodiment of the present invention.
Figure 3B:
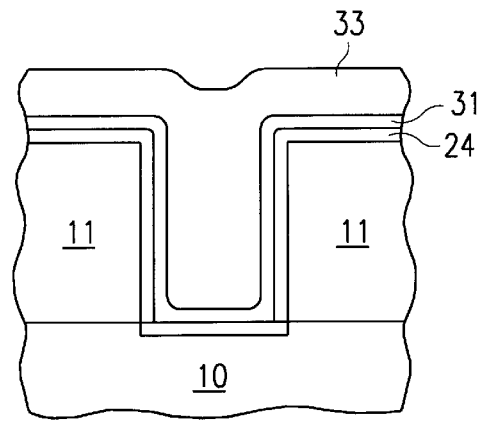
Figure 3C:
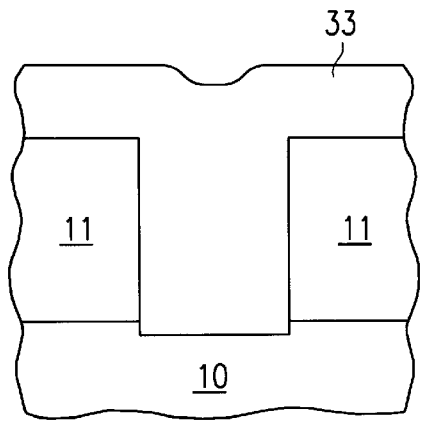

Another embodiment is shown in FIG. 3A through FIG. 3C. A nitrided surface layer 24 is formed on the exposed areas of the substrate 10 and the dielectric layer 11 in FIG. 3A. In FIG. 3B, a thin layer (approximately 10–20 nm) of tungsten nitride 31 is formed over the nitrided layer 24 followed by the formation (e.g., by chemical vapor deposition) of a tungsten layer 33 of sufficient depth to fill the via 13. The resulting structure is annealed at 800°–850°C. for 15–60 minutes, although other temperature ranges and time periods may be required to achieve the following result.

As result of the annealing, the nitride layer 24, the tungsten nitride layer 31 and the tungsten layer 33 are converted to a tungsten layer with a tungsten-silicon-nitride material at the interface of the tungsten plug with the interface.

Figure 4A:
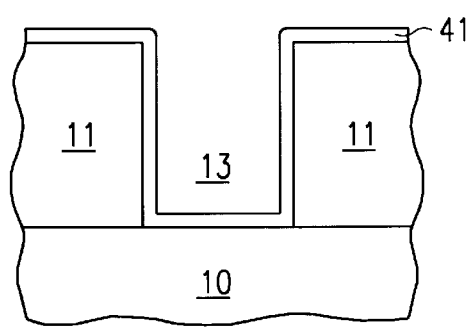
FIG. 4A through FIG. 4D illustrate a cross-sectional view of the formation of a conducting tungsten plug according to a third embodiment of the present invention.

In FIG. 4A through 4D, another embodiment of the present invention is shown. Referring to FIG. 4A, a via 13 has been formed in dielectric layer 11 exposing a portion of substrate 10. A layer of silicon 41 is formed on the exposed surface of the dielectric layer 11 and the exposed surface of the substrate 10.

Figure 4B:
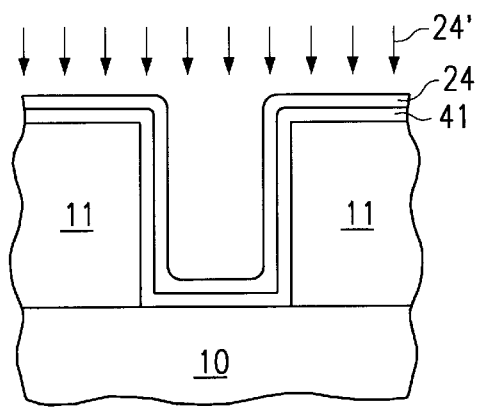
Figure 4C:
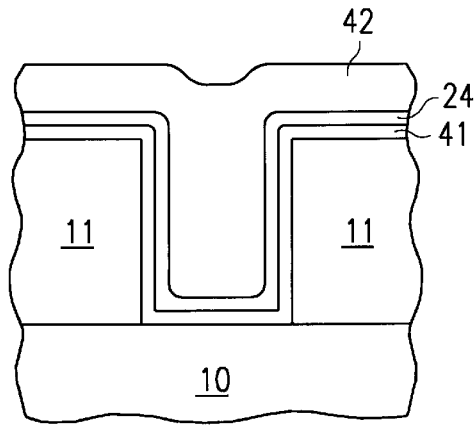
Figure 4D:
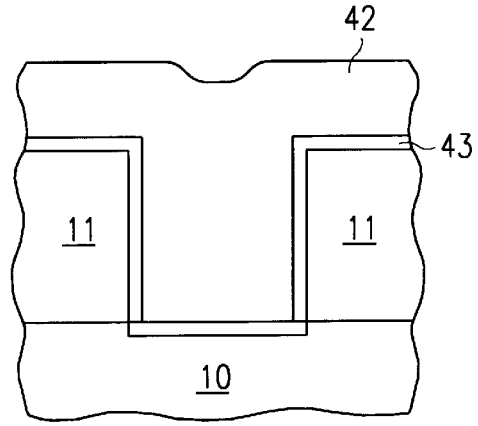

In FIG. 4B, a thin nitrided (silicon) surface layer 24 is formed on the silicon layer 41. In FIG. 4C, a layer 42 including at least one of the materials tungsten, tungsten/tungsten nitride and tungsten nitride is formed with sufficient thickness to fill via 13. In FIG. 4D, the structure is annealed to form a tungsten layer 42 and a $WSi_yN_z$ interface layer 43 between the tungsten plug layer and the exposed surface of the dielectric layer 11 and the exposed surface of the substrate 10.

2. Operation of the Preferred Embodiment(s)

The method of the present invention provides a thermally stable contact structure with low contact resistance between the tungsten conducting plug and the silicon substrate. The present invention further eliminates the need for additional deposition chambers that are required to form a titanium/titanium nitride contact region. The silicon, tungsten nitride and tungsten can be deposited in the same chamber thereby resulting in a higher throughput for the structure fabrication.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A method for fabricating an integrated circuit comprising the steps of:

forming a via through a dielectric layer to expose a portion of an underlying silicon layer;

forming a nitrided surface layer over said dielectric layer and said exposed portion of said underlying silicon layer;

forming a fill layer comprising tungsten over said nitrided surface layer, said fill layer filling said via; and after forming said fill layer, annealing said structure to form a tungsten plug with a tungsten-silicon-nitride interface region between said tungsten plug and said underlying silicon layer.

2. The method of claim 1, further comprising the step of forming a tungsten nitride layer over said nitrided surface layer prior to the steps of forming said fill layer and annealing said structure.

3. The method of claim 1, wherein said step of forming said nitrided surface layer comprises the step of exposing said dielectric layer and said exposed portion of the underlying silicon layer to a nitrogen-containing plasma.

4. The method of claim 1, further comprising the step of forming an overlying silicon layer over said dielectric and exposed portion of the underlying silicon layer prior to forming said fill layer, wherein said nitrided surface layer is formed on said overlying silicon layer.

5. The method of claim 1, wherein said fill layer comprises tungsten-nitride prior to said annealing step.

6. A method for fabricating an integrated circuit comprising the steps of:

forming a via through a dielectric layer to expose a portion of an underlying silicon layer;

forming a nitrided surface layer over said dielectric layer and said exposed portion of said underlying silicon layer;

forming a tungsten-nitride fill layer on said nitrided surface layer, said tungsten-nitride fill layer filling said via; and after forming said tungsten-nitride fill layer, annealing said structure to form a tungsten plug with a tungsten-silicon-nitride interface region between said tungsten plug and said underlying silicon layer.

7. The method of claim 6, further comprising the step of forming an overlying silicon layer over said dielectric layer and said underlying silicon layer, wherein said nitrided surface layer is formed on said overlying silicon layer.

8. A method for fabricating an integrated circuit comprising the steps of:

forming a via through a dielectric layer to expose a portion of an underlying silicon layer;

forming a nitrided surface layer over said dielectric layer and said exposed portion of said underlying silicon layer;

forming a tungsten-nitride layer on said nitrided surface layer;

forming a tungsten fill layer on said tungsten-nitride layer, said tungsten fill layer filling said via; and after forming said tungsten fill layer, annealing said structure to form a tungsten plug with a tungsten-silicon-nitride interface region between said tungsten plug and said underlying silicon layer.

9. The method of claim 8, further comprising the step of forming an overlying silicon layer over said dielectric layer and said underlying silicon layer, wherein said nitrided layer is formed on said overlying silicon layer.

* * * * *